United States Patent
Yamamoto

(10) Patent No.: US 12,255,274 B2
(45) Date of Patent: Mar. 18, 2025

(54) SEMICONDUCTOR LIGHT-EMITTING DEVICE

(71) Applicant: NIKKISO CO., LTD., Tokyo (JP)

(72) Inventor: Shuichiro Yamamoto, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 186 days.

(21) Appl. No.: 17/203,006

(22) Filed: Mar. 16, 2021

(65) Prior Publication Data

US 2021/0296544 A1    Sep. 23, 2021

(30) Foreign Application Priority Data

Mar. 18, 2020   (JP) ................... 2020-047461

(51) Int. Cl.
   *H01L 33/56*   (2010.01)
   *H01L 33/58*   (2010.01)
   *H01L 33/62*   (2010.01)

(52) U.S. Cl.
   CPC .............. *H01L 33/56* (2013.01); *H01L 33/58* (2013.01); *H01L 33/62* (2013.01)

(58) Field of Classification Search
   CPC .......... H01L 33/56; H01L 33/58; H01L 33/62
   See application file for complete search history.

(56) References Cited

U.S. PATENT DOCUMENTS

| | | | |
|---|---|---|---|
| 9,287,472 B2 | 3/2016 | Miki | |
| 9,929,324 B2 | 3/2018 | Miki | |
| 10,230,029 B2 | 3/2019 | Miki | |
| 2002/0037138 A1* | 3/2002 | Kaneko | G02B 6/4214 385/88 |
| 2009/0256166 A1* | 10/2009 | Koike | H01L 33/501 257/E33.059 |
| 2013/0037842 A1* | 2/2013 | Yamada | H01L 33/62 257/E33.072 |

(Continued)

FOREIGN PATENT DOCUMENTS

| | | |
|---|---|---|
| JP | H05-29663 A | 2/1993 |
| JP | 2011-228463 A | 11/2011 |

(Continued)

OTHER PUBLICATIONS

Official Action dated May 30, 2023 received from the Japanese Patent Office in related JP 2020-047461 together with English language translation.

(Continued)

*Primary Examiner* — Eliseo Ramos Feliciano
*Assistant Examiner* — Mikka Liu
(74) *Attorney, Agent, or Firm* — Scully, Scott, Murphy & Presser, PC

(57) ABSTRACT

A semiconductor light-emitting device includes a semiconductor light-emitting element for emitting ultraviolet light, a mounting substrate on which the semiconductor light-emitting element is mounted, bumps electrically connecting the semiconductor light-emitting element to the mounting substrate, a first sealing member sealing a connection region in which the semiconductor light-emitting element and the mounting substrate are connected by the bumps, and a second sealing member being provided on the first sealing member and sealing the semiconductor light-emitting element.

6 Claims, 4 Drawing Sheets

(56) References Cited

U.S. PATENT DOCUMENTS

| | | | | |
|---|---|---|---|---|
| 2015/0001563 A1* | 1/2015 | Miki | ................ | H01L 33/54 |
| | | | | 257/98 |
| 2016/0155914 A1 | 6/2016 | Miki | | |
| 2017/0154880 A1* | 6/2017 | Ozeki | ............... | H01L 24/26 |
| 2018/0182938 A1 | 6/2018 | Miki | | |
| 2019/0165224 A1* | 5/2019 | Tokunaga | ........... | H01L 33/62 |
| 2021/0184083 A1* | 6/2021 | Bohmer | ............ | H01L 33/50 |

FOREIGN PATENT DOCUMENTS

| | | |
|---|---|---|
| JP | 2012-069645 A | 4/2012 |
| JP | 2015-012081 A | 1/2015 |
| JP | 2018-014493 A | 1/2018 |
| TW | 201637247 A | 10/2016 |

OTHER PUBLICATIONS

Official Action dated Oct. 17, 2023 received from the Japanese Patent Office in related JP 2020-047461 together with English language translation.

Office Action dated Jun. 28, 2024 received from the Taiwanese Patent Office in related TW Application No. 110108237 together with English language translation.

\* cited by examiner

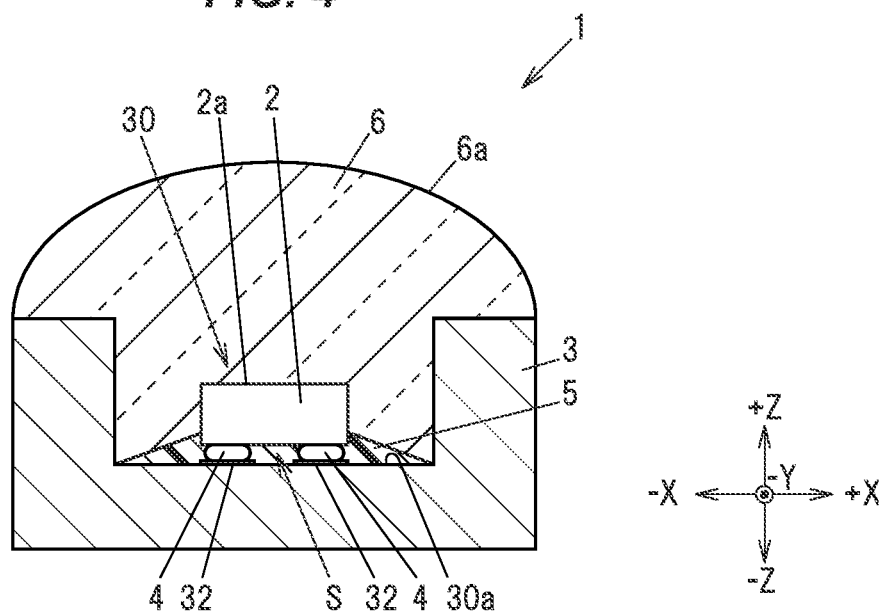

SEMICONDUCTOR LIGHT-EMITTING DEVICE

The present application is based on Japanese Patent Application No. 2020-047461 filed on Mar. 18, 2020, the entire contents of which are incorporated herein by reference.

BACKGROUND OF THE INVENTION

1. Field of the Invention

The invention relates to a semiconductor light-emitting device, in particular, to a semiconductor light-emitting device which emits ultraviolet light.

2. Related Art

Resin-sealed semiconductor light-emitting devices, in which a light-emitting diode (LED) is sealed with a sealing resin such as silicone resin, are conventionally provided (see, e.g., JPH5-29663).

In the semiconductor light-emitting device described in JPH5-29663, a light-transmitting filler having sedimentation properties is mixed to the sealing resin to suppress light scattering. This filler sinks down from an upper portion of the sealing resin and settles on a periphery of the semiconductor light-emitting element. In addition, the filler has a particle size allowing the filler to sink and settle on the periphery of the semiconductor light-emitting element during a sealing process in which the sealing resin is applied.

[Patent Document 1] JPH5-29663

In the resin sealing method described in JPH5-29663, the filler settles also on a light-exiting surface at the top of the semiconductor light-emitting element. Therefore, this method, when being used for semiconductor ultraviolet light-emitting elements emitting ultraviolet light, may cause a decrease in light output. In addition, when the filler has a size allowing the filler to sink and deposit on the periphery of the semiconductor light-emitting element, it is difficult for the filler to get in a gap space formed under the semiconductor light-emitting element and thermal expansion of the resin in the gap space cannot be sufficiently suppressed, which may decrease ability of withstanding a heating process such as reflow and thereby cause a decrease in reliability.

THE SUMMARY OF THE INVENTION

The invention was made in view of the problem described above and it is an object of the invention to provide a semiconductor light-emitting device which has improved ability of withstanding a heating process such as reflow, has high reliability and emits high-power ultraviolet light.

According to an aspect of the invention, a semiconductor light-emitting device, comprises:
- a semiconductor light-emitting element for emitting ultraviolet light;
- a mounting substrate on which the semiconductor light-emitting element is mounted;
- bumps electrically connecting the semiconductor light-emitting element to the mounting substrate;
- a first sealing member sealing a connection region in which the semiconductor light-emitting element and the mounting substrate are connected by the bumps; and
- a second sealing member being provided on the first sealing member and sealing the semiconductor light-emitting element.

Effects of the Invention

According to the present invention, it is possible to provide a semiconductor light-emitting device which has improved ability of withstanding a heating process such as reflow, has high reliability and emits high-power ultraviolet light.

BRIEF DESCRIPTION OF THE DRAWINGS

Next, the present invention will be explained in more detail in conjunction with appended drawings, wherein:

FIG. 4 is a schematic cross-sectional view showing the semiconductor light-emitting device in a modification of the invention.

DESCRIPTION OF THE PREFERRED EMBODIMENT

Embodiment

An embodiment of the invention will be described below in reference to the drawings. The embodiment below is described as a preferred illustrative example for implementing the invention. Although some part of the embodiment specifically illustrates various technically preferable matters, the technical scope of the invention is not limited to such specific aspects.

Figure 1:
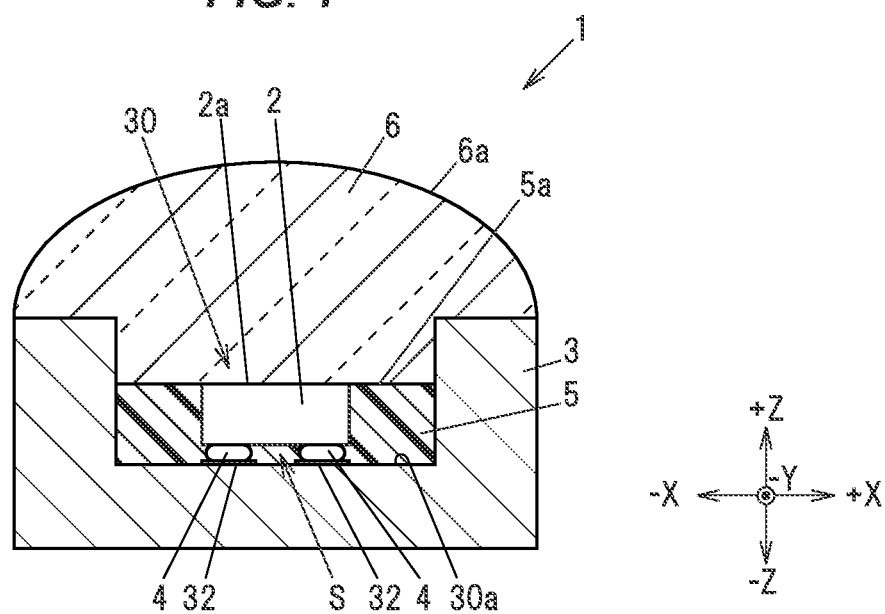
FIG. 1 is a schematic cross-sectional view showing a semiconductor light-emitting device in an embodiment of the present invention.

FIG. 1 is a schematic explanatory cross-sectional view showing a semiconductor light-emitting device in an embodiment of the invention. A semiconductor light-emitting device 1 includes a semiconductor light-emitting element 2 which emits ultraviolet light, a package substrate 3 on which the semiconductor light-emitting element 2 is mounted, bumps 4 electrically connecting the semiconductor light-emitting element 2 to the package substrate 3, a filler-containing resin 5 which seals a connection region in which the semiconductor light-emitting element 2 and the package substrate 3 are connected by the bumps 4, and a sealing resin 6 which seals the semiconductor light-emitting element 2. Next, each member will be described in detail. The package substrate 3 is an example of the mounting substrate. The filler-containing resin 5 is an example of the first sealing member. The sealing resin 6 is an example of the second sealing member.

(Semiconductor Light-Emitting Element 2)

Figure 2:
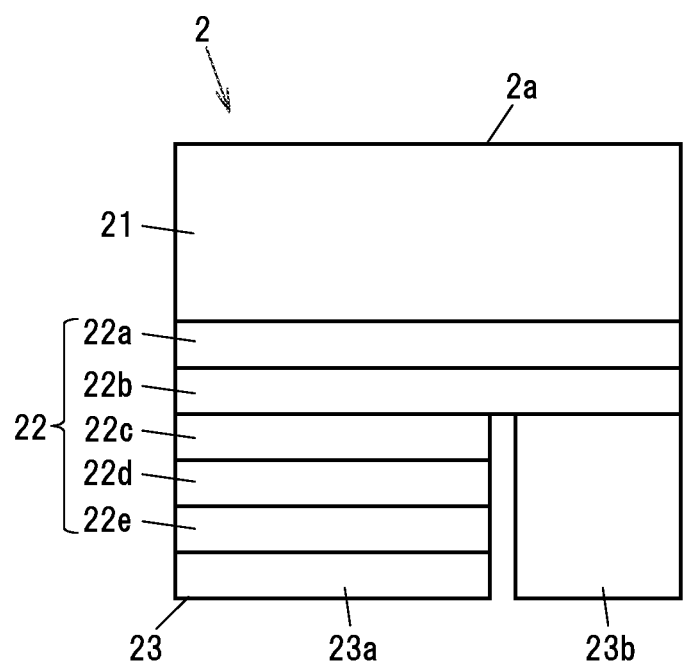
FIG. 2 is explanatory diagram illustrating an example of a stacked structure of a semiconductor light-emitting element.

FIG. 2 is explanatory diagram illustrating an example of a stacked structure of the semiconductor light-emitting element. The semiconductor light-emitting element 2 is composed of an ultraviolet light-emitting diode (Light Emitting Diode: LED) which emits ultraviolet light with a wavelength of not more than 360 nm (including deep ultraviolet light). As shown in FIG. 2, the semiconductor light-emitting element 2 has a growth substrate 21 made of sapphire, an AlGaN-based nitride semiconductor layer 22 formed on the growth substrate 21, and an electrode 23.

In the present embodiment, the nitride semiconductor layer 22 is configured such that a buffer layer 22a made of AlN, an n-cladding layer 22b made of n-type AlGaN, a light-emitting layer 22c including AlGaN, a p-cladding layer 22d made of p-type AlGaN, and a contact layer 22e made of p-type GaN are sequentially formed in this order from the growth substrate 21-side.

The electrode 23 has an anode-side electrode (p-electrode) 23a formed on the contact layer 22e and a cathode-side electrode (n-electrode) 23b formed on the n-cladding layer 22b.

(Package Substrate 3)

The package substrate 3 is an inorganic material substrate including ceramic. In particular, the package substrate 3 is made of, e.g., a high temperature co-fired ceramic (HTCC) multi-layered substrate.

The package substrate 3 is formed in a substantially rectangular parallelepiped shape and has a recessed portion 30 which is formed on one surface (hereinafter, also referred to as the "upper surface", see the +Z direction shown in the drawing) and houses the semiconductor light-emitting element 2.

The semiconductor light-emitting element 2 is housed in the recessed portion 30 of the package substrate 3 as described above and is mounted on a bottom surface 30a of the recessed portion 30. That is, the bottom surface 30a forms a mounting surface on which the semiconductor light-emitting element 2 is mounted. An electrode 32 for electrically connecting the semiconductor light-emitting element 2 (hereinafter, also referred to as a "substrate-side electrode") (see FIG. 3) is provided on the bottom surface 30a.

The semiconductor light-emitting element 2 is flip-chip mounted on the package substrate 3 in such a matter that the growth substrate 21 is located on the upper side (on the opening side of the recessed portion 30) and the nitride semiconductor layer 22 is located on the lower side (on the bottom surface 30a side of the recessed portion 30, on the package substrate 3 side). The electrodes 23a, 23b are electrically connected, via the bumps 4, to the substrate-side electrode 32 provided on the package substrate 3.

In the present embodiment, ultraviolet light emitted by the light-emitting layer 22c passes through the growth substrate 21 and is guided to the outside of the semiconductor light-emitting element 2. Therefore, in the present embodiment, a surface of the growth substrate 21 (a surface opposite to the nitride semiconductor layer 22) serves as a light-exiting surface 2a of the semiconductor light-emitting element 2.

(Bump 4)

The bumps 4 electrically connect the semiconductor light-emitting element 2 to the substrate-side electrode 32 which is formed on the bottom surface 30a of the recessed portion 30 of the package substrate 3. The bumps 4 are, e.g., gold stud bumps having a disc shape.

(Filler-Containing Resin 5)

The filler-containing resin 5 is a resin including an added filler therein. In the present embodiment, the filler-containing resin 5 seals a gap space S formed between the semiconductor light-emitting element 2 and the bottom surface 30a of the recessed portion 30 of the package substrate 3.

Figure 3:
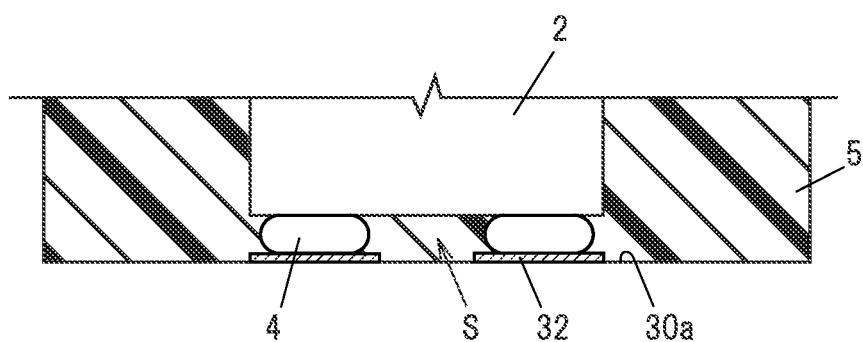
FIG. 3 is an explanatory diagram illustrating a width of a gap space.

FIG. 3 is a diagram for explaining a width of the gap space S and is an enlarged view of the bottom portion of the semiconductor light-emitting device 1 shown in FIG. 1. The width of the gap space S is the sum of the height of the stud bump and the height of the substrate-side electrode 32. The height of the stud bump is about 5 μm to 30 μm and is typically about 20 μm, the height of the substrate-side electrode 32 is about 5 μm to 120 μm, and the width of the gap space S is not less than 10 μm and not more than 150 μm. In the present embodiment, the height of the stud bump is about 20 μm, the height of the substrate-side electrode 32 is about 5 to 10 μm, and the width of the gap space S is about 25 to 30 μm.

The filler-containing resin 5 with a linear expansion coefficient of not more than $1\times10^{-4}$/K is used. This is to reduce expansion during the heating process such as reflow and thereby suppress the semiconductor light-emitting element 2 from being detached from the package substrate 3.

A base material (hereinafter, also referred to as "matrix") of the filler-containing resin 5 is made of, e.g., a resin having a transmittance to a wavelength of the emitted light of not less than 75% (in this example, a wavelength in the ultraviolet region of not more than 360 nm; hereinafter, the same kind of explanation will be omitted). Preferably, the transmittance of the matrix to the wavelength of the emitted light is not less than 85%. In particular, a resin consisting mainly of a silicone resin may be used as the matrix.

Meanwhile, as an added filler material in the filler-containing resin 5, it is desirable to use an inorganic filler comprising mainly of an inorganic material which does not have an optical absorption edge within the wavelength range of the emitted light. In particular, the type of the filler material includes silica, quartz, alumina, diamond, hafnia, zirconia, magnesium oxide, aluminum nitride, and boron nitride, etc.

In addition, the filler material is preferably made of a porous structure. The reason for this is that bonding between the filler material and the matrix of the filler-containing resin 5 is enhanced by the porous structure and linear expansion coefficient of the filler-containing resin 5 is thereby reduced. The diameter of pores formed on the porous filler material (average, mode) is called a pore diameter, and a microporous filler material made of a porous structure having a pore diameter of 100 to 1000 nm is used in the present embodiment. In this case, the filler-containing resin 5 with a linear expansion coefficient of not more than $1\times10^{-4}$/K is obtained. In this regard, the filler-containing resin 5 with a linear expansion coefficient of not more than $1\times10^{-4}$/K can be obtained also when using a mesoporous filler material having a pore diameter of 2 to 50 nm.

In addition, the filler material has a size smaller than the width of the gap space S so that the filler material can get in the gap space S formed between the semiconductor light-emitting element 2 and the bottom surface 30a. In particular, the filler material is preferably not more than 25 μm in diameter, more preferably, not more than 10 μm. The shape of the filler material is not limited to a sphere and may be a shape with protrusions on a spherical surface or a polyhedral shape, and in this case, the diameter means a diameter of a sphere circumscribed around the filler. In addition, since the particle size of the filler material has a distribution, the value of the diameter described above is a value as an average or a mode, etc. The diameter of the filler material is preferably not more than 10 μm so as to evenly arrange the filler material in the gap space S, but when the diameter of the filler material is smaller, the filler-containing resin 5 has a higher viscosity and lower flowability and it is thus difficult to seal the gap space S with the resin 5. In such a case, it is possible to improve flowability and also evenly arrange the filler material in the gap space S by using, e.g., a resin to which two or more types of fillers with different diameters, such as a filler with a diameter of not more than 10 μm and a filler with a diameter of not more than 25 μm, are added.

A percentage by weight of the filler material in the filler-containing resin 5 is not less than 10 weight percent concentration (hereinafter, also referred to as "wt %"), more preferably, not less than 50 wt % and not more than 75 wt %. Meanwhile, a percentage by volume of the filler material in the filler-containing resin 5 is not less than 5 volume percent concentration (hereinafter, also referred to as "vol %"), preferably, not less than 25 vol %. With the filler material having a diameter of about 10 μm, the concentration of the filler and flowability of the resin 5, which are enough to arrange the filler material in the gap space S, can be both achieved when the percentage by weight of the filler material is about 50 wt %.

In the present embodiment, only a region lower than the light-exiting surface 2a of the semiconductor light-emitting element 2 (on the bottom surface 30a side, on a side in the −Z direction shown in FIG. 1) is sealed with the filler-containing resin 5. That is, the filler-containing resin 5 is applied to fill to a position lower than the light-exiting surface 2a of the semiconductor light-emitting element 2. In other words, an upper surface 5a of the filler-containing resin 5 (a boundary surface with the sealing resin 6) is located lower than the light-exiting surface 2a of the semiconductor light-emitting element 2. This is to suppress a decrease in light output due to deposition of the filler material on the light-exiting surface 2a of the semiconductor light-emitting element 2.

The filler-containing resin 5 only needs to be applied so as not to overflow onto the light-exiting surface 2a of the semiconductor light-emitting element 2, and the filler-containing resin 5 can be applied to fill to a position slightly lower than the light-exiting surface 2a of the semiconductor light-emitting element 2 or to the same height as the light-exiting surface 2a of the semiconductor light-emitting element 2, as shown in FIG. 1.

Sealing Resin 6

The sealing resin 6 is provided so as to entirely cover the semiconductor light-emitting element 2. In particular, the sealing resin 6 is applied on the filler-containing resin 5 in the recessed portion 30 of the package substrate 3 and is further provided so as to bulge upward from the package substrate 3.

In addition, the sealing resin 6 is formed so that its upper surface 6a forms a smoothly curved surface (e.g., a hemispherical shape or a semi-elliptical spherical shape). This shape can reduce total reflection at a boundary between the sealing resin 6 and the air and thereby improve light extraction efficiency as compared when, e.g., the upper surface is a flat surface.

The sealing resin 6 also serves as a lens for controlling a direction in which ultraviolet light is emitted. In addition, it is desirable to use the sealing resin 6 which has a refractive index between the refractive index of a member constituting the light-exiting surface 2a of the semiconductor light-emitting element 2 (in this example, sapphire) and the refractive index of the air. This improves efficiency of extracting ultraviolet light from the light-exiting surface 2a of the semiconductor light-emitting element 2, thereby contributing to improvement in luminous intensity.

It is desirable to use the sealing resin 6 of which transmittance to ultraviolet light emitted from the semiconductor light-emitting element 2 is as high as possible, and the transmittance of the sealing resin 6 to the wavelength of the emitted light is not less than 75%. More preferably, the transmittance of the sealing resin 6 to the wavelength of the emitted light is not less than 85%.

In addition, it is desirable to use the sealing resin 6 which does not easily deteriorate due to ultraviolet light. In particular, a resin consisting mainly of a silicone resin may be used as the sealing resin 6.

(Modification 1)

FIG. 4 is a schematic cross-sectional view showing the semiconductor light-emitting device 1 in a modification of the invention. Although the filler-containing resin 5 is applied to fill to a position close to the light-exiting surface 2a of the semiconductor light-emitting element 2 (the upper surface of the semiconductor light-emitting element 2) in the embodiment, the filler-containing resin 5 is not necessarily applied to fill to a certain height. To achieve the objective of suppressing thermal expansion of the resin in the gap space S, the filler-containing resin 5 only needs to fill at least the gap space S and to seal the periphery of the bumps 4, and may seal, e.g., only the lower portion of the semiconductor light-emitting element 2 as shown in FIG. 4. The periphery of the gap space S and the bumps 4 is an example of the connection region.

(Modification 2)

Although the cavity-shaped package substrate 3 having the recessed portion 30 has been described as an example in the embodiment, the package substrate 3 is not necessarily limited to a substrate having the cavity shape and may be, e.g., a substrate having a flat-plate shape or a substrate having a circular disk shape.

SUMMARY OF THE EMBODIMENT

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A semiconductor light-emitting device (1), comprising: a semiconductor light-emitting element (2) for emitting ultraviolet light; a mounting substrate on which the semiconductor light-emitting element (2) is mounted; bumps (4) electrically connecting the semiconductor light-emitting element (2) to the mounting substrate; a first sealing member sealing a connection region in which the semiconductor light-emitting element (2) and the mounting substrate are connected by the bumps (4); and a second sealing member being provided on the first sealing member and sealing the semiconductor light-emitting element (2).

[2] The semiconductor light-emitting device (1) described in [1], wherein a width of the connection region is not less than 10 μm and not more than 150 μm.

[3] The semiconductor light-emitting device (1) described in [1] or [2], wherein the first sealing member is applied to fill to a position lower than a light-exiting surface of the semiconductor light-emitting element (2).

[4] The semiconductor light-emitting device (1) described in any one of [1] to [3], wherein a base material of the first sealing member comprises a resin having a transmittance to the ultraviolet light of not less than 75%.

[5] The semiconductor light-emitting device (1) described in [4], wherein the base material comprises a resin comprising mainly a silicone resin.

[6] The semiconductor light-emitting device (1) described in any one of [1] to [5], wherein the first sealing member comprises a resin containing an added filler material.

[7] The semiconductor light-emitting device (1) described in [6], wherein the filler material comprises an inorganic filler.

[8] The semiconductor light-emitting device (1) described in [7], wherein the inorganic filler comprises silica, quartz, alumina, diamond, hafnia, zirconia, magnesium oxide, aluminum nitride or boron nitride.

Although the embodiment of the invention has been described, the invention according to claims is not to be limited to the embodiment described above. Further, please note that all combinations of the features described in the embodiment are not necessary to solve the problem of the invention. In addition, the invention can be appropriately modified and implemented without departing from the gist thereof.

What is claimed is:

1. A semiconductor light-emitting device, comprising:
   a semiconductor light-emitting element having a top surface for emitting ultraviolet light and a bottom surface;
   a mounting substrate having a top surface and a recessed portion, the recessed portion having a bottom surface lower than the top surface of the substrate, the semiconductor light-emitting element being mounted in the recessed portion such that the top surface of the semiconductor light-emitting element is lower than the top surface of the mounting substrate;
   bumps electrically connecting the bottom surface of the semiconductor light-emitting element to the mounting substrate;
   a first sealing member sealing a connection region in which the semiconductor light-emitting element and the mounting substrate are connected by the bumps, the first sealing member comprising a resin containing an added filler material, the added filler material being located within the connection region, the first sealing member filling a region extending from the top surface of the semiconductor light-emitting element to the bottom surface of the recessed portion; and
   a second sealing member being provided on the first sealing member and sealing the semiconductor light-emitting element in the recessed portion, the second sealing member covering the top surface of the semiconductor light-emitting element, the top surface of the substrate and a top surface of the first sealing member.

2. The semiconductor light-emitting device according to claim 1, wherein a width of the connection region is not less than 10 μm and not more than 150 μm.

3. The semiconductor light-emitting device according to claim 1, wherein a base material of the first sealing member comprises a resin having a transmittance to the ultraviolet light of not less than 75%.

4. The semiconductor light-emitting device according to claim 3, wherein the base material comprises the resin comprising mainly a silicone resin.

5. The semiconductor light-emitting device according to claim 1, wherein the filler material comprises an inorganic filler.

6. The semiconductor light-emitting device according to claim 5, wherein the inorganic filler comprises silica, quartz, alumina, diamond, hafnia, zirconia, magnesium oxide, aluminum nitride or boron nitride.

* * * * *